United States Patent
Cutcher et al.

(10) Patent No.: US 7,203,471 B2
(45) Date of Patent: Apr. 10, 2007

(54) SYSTEM AND METHOD FOR SELECTIVELY UTILIZING AN ATTENUATION DEVICE IN A TWO-WAY RADIO RECEIVER BASED ON SQUELCH DETECT AND RADIO SIGNAL STRENGTH INDICATION (RSSI)

(75) Inventors: Jeffrey Lee Cutcher, Plantation, FL (US); Aiguo Ruan, Wellington, FL (US)

(73) Assignee: Motorola, Inc., Schaumburg, IL (US)

( * ) Notice: Subject to any disclaimer, the term of this patent is extended or adjusted under 35 U.S.C. 154(b) by 450 days.

(21) Appl. No.: 10/331,373

(22) Filed: Dec. 30, 2002

(65) Prior Publication Data

US 2004/0203403 A1  Oct. 14, 2004

(51) Int. Cl.
*H04B 1/16* (2006.01)

(52) U.S. Cl. .................................. 455/212; 455/200.1

(58) Field of Classification Search ................ 455/218, 455/225, 224, 115.3, 154.1, 1, 63.1, 550, 455/212, 200.1
See application file for complete search history.

(56) References Cited

U.S. PATENT DOCUMENTS

| | | | | |
|---|---|---|---|---|
| 4,872,204 A | * | 10/1989 | Hammer et al. | 455/515 |
| 4,969,207 A | * | 11/1990 | Sakamoto et al. | 455/134 |
| 5,303,406 A | * | 4/1994 | Hansen et al. | 455/222 |
| 2002/0065096 A1 | * | 5/2002 | Yamamoto | 455/550 |

* cited by examiner

*Primary Examiner*—Edward F. Urban
*Assistant Examiner*—Tu X. Nguyen

(57) ABSTRACT

A system and method used for controlling an attenuator in a two-way communication device (100, 200) includes the steps of measuring (211) a relative signal strength indication (RSSI) at the input of the two-way communications device. The RSSI measurement is then compared (213, 217, 223) to both at least one predetermined interference threshold value (T1, T2, T3) and a selective squelch state (219, 225) for determining whether to switch an in-line attenuator to the input of the two-way communications device. The invention provides a method by which an attenuator may be used only when interference is present without it being continually switched in-line to cause signal degradation.

4 Claims, 2 Drawing Sheets

SYSTEM AND METHOD FOR SELECTIVELY UTILIZING AN ATTENUATION DEVICE IN A TWO-WAY RADIO RECEIVER BASED ON SQUELCH DETECT AND RADIO SIGNAL STRENGTH INDICATION (RSSI)

TECHNICAL FIELD

This invention relates in general to two-way communications systems and more particularly to interference reduction through the use of an attenuator in a two-way radio receiver.

BACKGROUND

Two-way radios are typically designed with a robust amount of gain in their front end amplifier stages. As is well known in the art, one drawback of providing too much gain occurs when multiple communications systems are operated in close proximity to one another. The radio frequency (RF) gain stages of the radio receiver can both provide gain but can also act to enhance interfering signals. Generally, the cause of this type of problem stems from intermodulation distortion (IMD) and adjacent channel interference, which degrade radio performance in the form of poor radio reception. Intermodulation distortion interference occurs from adjacent channel interference that mixes with other RF signals to produce an unwanted RF signal on or near the receiver filter pass-band. This type of interference is becoming more common every day as radio spectrum becomes more crowded with differing types of users, RF signal power levels, and modulation schemes that all attempt to fit into a finite space.

In the past, one common way to help the receiver reduce this type of interference has been through the use of an attenuator device. The attenuator is a circuit the may be inserted between the antenna of the radio receiver and the RF amplifier circuitry in order to reduce the amount of RF energy reaching the receiver. As a general rule since the intermodulation product is a third order non-linear expression, every one decibel (dB) of attenuation that is switched in circuit provides a three dB reduction in the amount of intermodulation interference in the radio receiver.

One method currently used to control an attenuator for controlling this type of interference is through the use of a radio signal strength indication (RSSI) measurement. In this method, the signal strength is typically measured at the antenna or at some point in the RF amplifier chain in order to determine the absolute signal strength of the input radio signal. The signal strength may also be mathematically computed in a digital signal processor (DSP). If the radio signal reaches some predetermined threshold, then an attenuator may be switched into the receiving circuit in order to reduce the amount of interference that might be caused by this high signal condition. In some schemes, attenuation may even be switched in a stepped fashion where a greater amount of attenuation is used depending on the level of the RF input signal. Other schemes may use the RSSI measurement in conjunction with a carrier squelch (CSQ) detector circuit or software. However, CSQ is solely dependent on the RSSI measurement and not some "known" information.

The problem associated with these types of arrangements is that the receiver cannot determine if the received RF signal is an actual signal to be received or if the high RSSI level is merely interference or a combination of both. In general, when interference is present, the RSSI level is the sum of both the desired signal power and the interference power. Since both an on-channel signal and off-channel interference will provide a high RSSI level, the attenuator will continually be left in-line. This severely reduces the sensitivity of the receiver in situations where low RSSI levels need to be received. Communications are often missed since the receiver does not receive these lesser signals in view of the attenuator that is always in circuit. Still further methods have been developed and used in connection with the RSSI measurement such as measuring the incoming bit error rate (BER) against the signal strength to decide if the incoming signal is an actual signal or an interfering one. In many two way radio communications systems there is no digital bit information available to compute the BER. However, many two way radio communications systems have some form of squelch detect circuitry or software that utilizes "known" information for the purpose of unsquelching or unmuting the radio speaker. This information may be in the form of synchronization data as well as sub-audible tones such as a sinusoidal tone or a digital signal.

Thus, there is a need to provide a method for a radio receiver that requires the use of this "known" incoming data, for selectively switching an attenuator in connection with an RF input signal. This would work to ultimately optimize the performance of the radio receiver by enabling the user to accurately receive various signal levels of incoming information while still enabling an attenuator circuit in situations where adjacent channel interference or high on-channel signal levels are present.

SUMMARY OF THE INVENTION

Briefly, according to the invention, there is provided a method for selectively inserting an attenuation device in a two-way radio receiver based on a squelch detector circuit or software that utilizes "known" information (such as sub-audible tones or synchronization data) and radio signal strength indication (RSSI) measurements. Rather than always attenuating an receiver input signal when a relatively high on-channel or off-channel RSSI is received, the invention utilizes a plurality of interference threshold limits that are compared against an RSSI measurement in order to determine if an input signal should be attenuated. The interference threshold limits are used in connection with a receiver status condition such as whether the receiver is in a muted or un-muted state. This allows the receiver to make a determination as whether to switch the attenuator to an ON state or allow the attenuator to remain in an OFF state. Hence, the attenuator will be used at the proper time to insure the receiver maintains a high level of sensitivity at times when no off-channel interference is present.

BRIEF DESCRIPTION OF THE DRAWINGS

The features of the present invention, which are believed to be novel, are set forth particularly in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
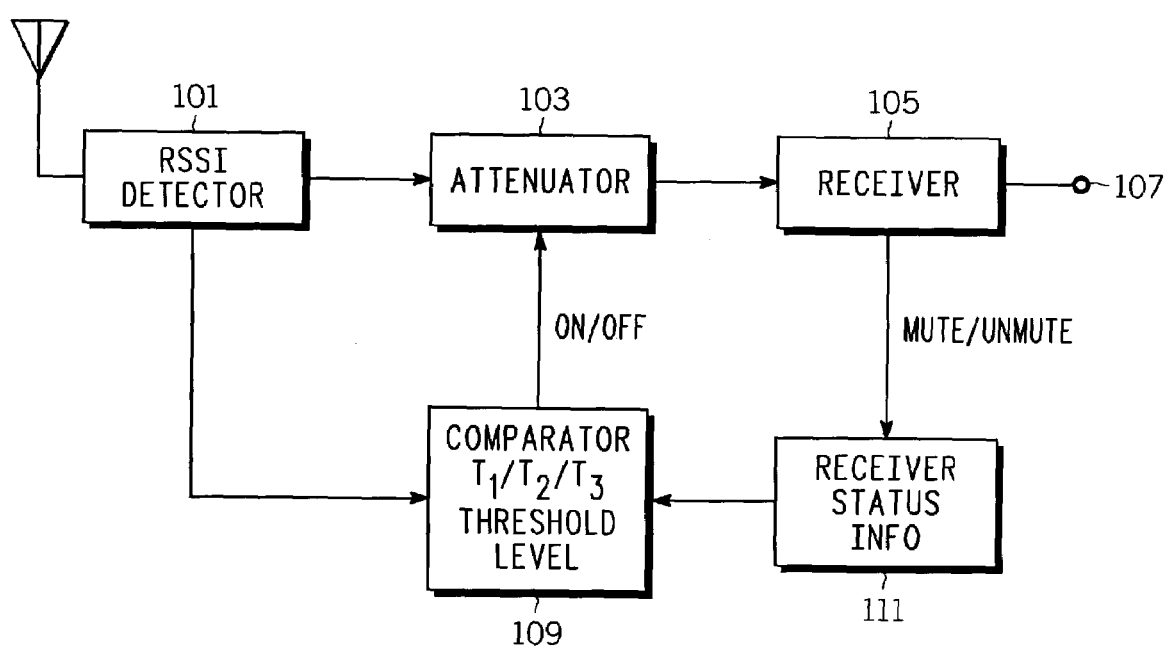
FIG. 1 is a block diagram illustrating the operation of the attenuator in the radio receiver according to the preferred embodiment of the invention.

While the specification concludes with claims defining the features of the invention that are regarded as novel, it is believed that the invention will be better understood from a consideration of the following description in conjunction with the drawing figures, in which like reference numerals are carried forward.

As seen in FIG. 1, a system describing the preferred system and method of selectively utilizing attenuation in a radio receiver 100, includes a radio signal strength indication (RSSI) used in connection with detector 101. The RSSI is used to determine the radio frequency (RF) signal strength of an incoming signal. Those skilled in the art will recognize that the terms radio, receiver, and transceiver are synonymous throughout this description and may be used interchangeably. The RF signal strength may include both on-channel signals as well as inter-modulation interference that is a result of off-channel interference mixing with both oscillator and amplifier stages in the radio to produce unwanted on-channel signal components that end up on the desired frequency of reception.

An attenuator 103 is used by the receiver 105 to reduce the amplitude of the input signal so that it may be more easily demodulated at the receiver input. This process as described herein, includes utilizing a comparator 109 to compare the RSSI measurement with a plurality of predetermined threshold levels. This comparison along with information relating to receiver status 111 is then used to control the on or off state of the attenuator 103. The receiver status information is typically determined by a user and a digital signal processor (DSP) and indicates whether the receiver 105 is in a muted or unmuted condition. Since the radio 105 includes some type of squelch algorithm and/or software to control the muted or unmuted condition of the audio output 107 in receiver 105, this information is then used by the comparator in order to determine when to attenuate the RF input signal.

Figure 2:
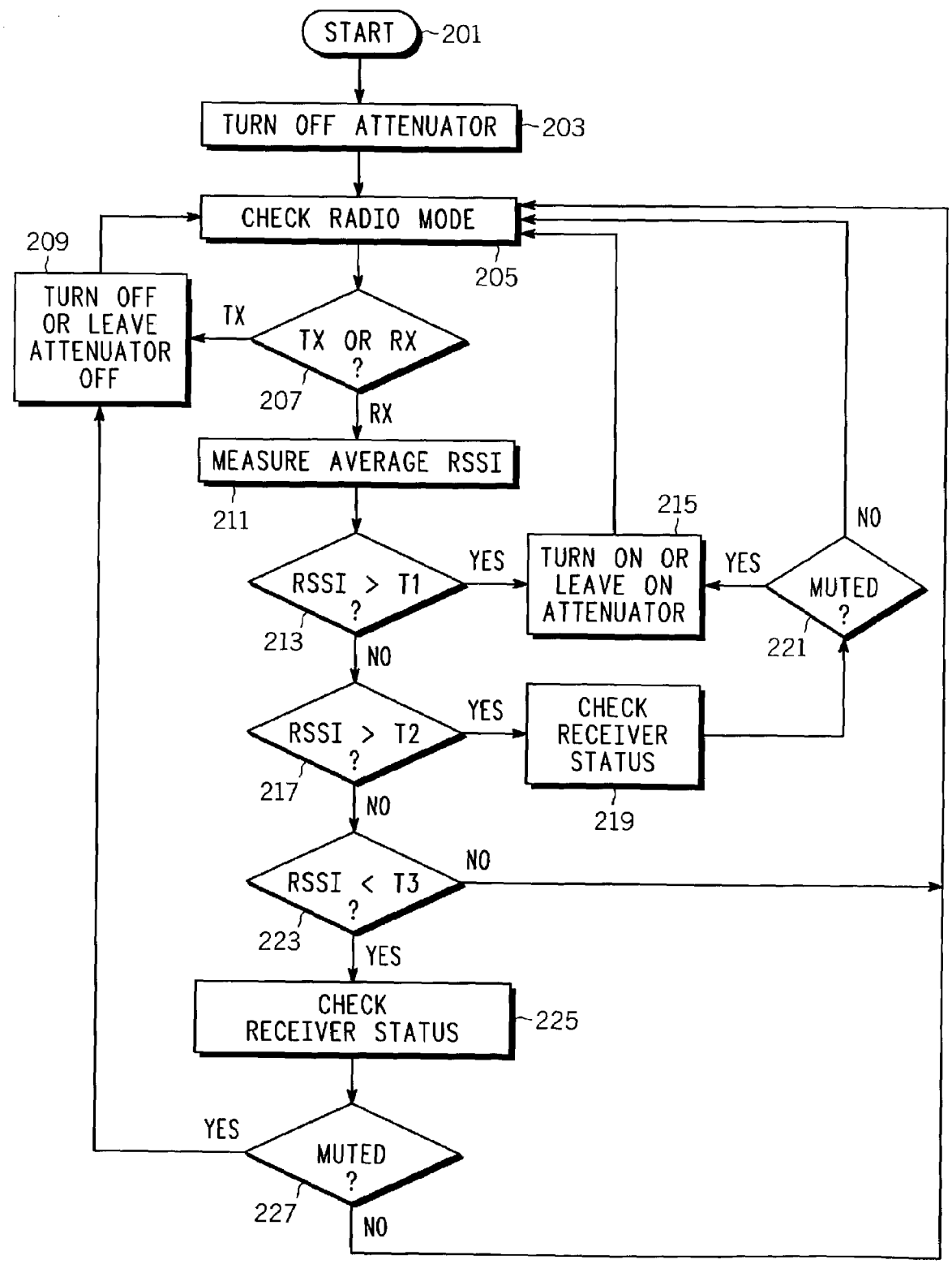
FIG. 2 is a flow chart diagram showing a method for determining insertion of an attenuation device in a two-way radio receiver based on squelch detect and radio signal strength indication (RSSI) according to the preferred embodiment of the invention.

Referring now to FIG. 2, a flow chart diagram illustrating a method 200 for determining the on or off state of an attenuation device in a two-way radio receiver based on squelch detect and radio signal strength indication (RSSI) according to the preferred embodiment of the invention includes switching 201 the radio receiver to powered "on" mode. The radio is initialized by software within the radio and controls 203 an internal attenuation device i.e. an attenuator is set to an OFF state. As will be further evident to those skilled in the art, an attenuation device is a device for reducing a radio frequency (RF) input signal magnitude level by a variable and/or fixed amount. In the preferred embodiment of the present invention, only a fixed attenuator is used however further embodiments could use a variable attenuation scheme.

After the attenuator is switched to an OFF state, the mode of the radio is then checked 205 to determine if it is in a transmit or receive state 207. If the radio is in a transmit state, then the attenuator positioned in-line with the receiver chain remains in an OFF state 209 and the transceiver will again check 205 to determine its mode of operation. It will be recognized by those skilled in the art that some radio transceivers utilize an attenuator on the receiver input during transmit in order to better isolate the receiver from RF interference. In the preferred embodiment of this invention, the attenuator will remain in an OFF state during the transmit mode of the transceiver.

When the receiver is in a receive mode 207, the relative signal strength indication is measured 211 at some predetermined location in the transceiver radio frequency (RF) amplifier chain. This might include measurement directly at the antenna or at any stage in the RF amplifier circuitry. In the case of a digital transceiver, the real (I) and imaginary (Q) components of the digital signal can be mathematically computed within the DSP or at the output of an analog-to-digital detector circuit. Thus, an absolute value is presented by a detector representing the RSSI received by the radio. This number is absolute and does not take into account whether the RF signal that is received is an on-channel signal or perhaps off-channel RF interference. This information is then used to determine what state the transceiver's attenuator is set in order to insure all received information is presented to a user.

The first comparison 213 for the transceiver is to determine if an exceptionally high amount of RF energy is being received by the receiver. For example, if the RSSI measurement is greater than a first interference threshold level T1, which might be set at approximately −40 dBm, then the receiver would recognize that attenuation would be required in order to protect the receiver's RF amplifier circuitry from damage. In that case, the attenuator is switched 215 to an ON state. The mode of the radio is again checked 205 to determine if the transceiver is in a transmit or receive state. In this situation the attenuator will remain in an ON state as long as the RSSI measurement remains greater than the first interference threshold level T1.

If the RSSI measurement drops below the first interference threshold level T1, then a second comparison is made to determine if attenuation is needed to eliminate or reduce off-channel interference that may produce intermodulation distortion (IMD). For example, the second interference threshold level T2 might be set to −80 dBm. In the comparison 217, if the RSSI measurement is greater than the second interference threshold level T2, the status of the receiver is determined 219. This determination is based upon whether the receiver is squelched or muted 221. As is well known in the art, muting is generally based on the selective squelch setting of the transceiver either in an analog or digital mode. In each of these modes, a host and digital signal processor (DSP) determines if the squelch criteria is met before setting an un-mute flag. Un-muting would permit audio to be ported to the radio's internal speaker. In an analog trunking mode this might take the form of a connect tone on the voice channel similar to a private line (PL) tone. Moreover, there is also low speed data from a control channel that may be used for this purpose.

In the digital trunking mode, either control channel data or information related to identification (ID) embedded in each data frame used for synchronization may be used by the inventor to determine a mute or un-mute status. In an analog simplex mode, a user may employ PL or digital private line (DPL) information as used with a selective squelch and known user identification. In a digital simplex mode, the receiver may utilize frame synchronization information as described for a commonly implemented digital trunking mode. With a plurality of apriori information based on mode of operation, the transceiver can determine when to un-mute and consequently when any attenuation should be switched to an ON state.

If the receiver is muted 221, then the attenuator is switched 215 to an ON state and the process begins again where the mode of the transceiver is checked 205 and new RSSI measurements are calculated 211. If the receiver remains muted i.e. the squelch or muting algorithm is not triggered however the RSSI remains greater than the second interference threshold level T2, the transceiver determines that interference is being received and switches the attenuator to an ON state. This occurs in order to reduce attention levels at the receiver input so that reasonable on-channel signal levels can be attained. This allows valid information to be demodulated without interference and/or distortion. If the transceiver is not muted 221, then the transceiver determines that it must be receiving valid information that is not subject to interference. In this case, no attenuation would be needed and the receiver is again checked 205 for operating mode and new RSSI measurements are calculated 211.

If the RSSI measurements are less than the second interference threshold level T2, the measurement is compared 223 against a third interference threshold level T3. For example, the third interference threshold level T3, might be set at −120 dBm (or the radio sensitivity level). If the RSSI is greater than the third interference threshold level T3, then the receive status is again checked 225. If the receiver is muted 227, then the received signal level is deemed lower than what the receiver can detect and the attenuator is turned to an OFF state. The process continues again through the loop where the mode is checked 205 and new RSSI values are measured 211. If the radio is un-muted and if the RSSI measurement is less than the third interference threshold level T3, then the receiver determines that valid information is still being received and the process begins anew with a check of the radio mode 205. It will be further evident to those skilled in the art that state timers may be implemented for use in connection with the attenuator on or off state threshold crossings. Generally, the timers may be similar to a debounce circuit in that the algorithm will not consider a threshold crossing until that threshold remains crossed for some predetermined period of time. The use of threshold crossings timers helps to combat problems associated with the effects of fading and random noise.

Thus, in view of this new process for determining when to switch the attenuator in-line and/or to an ON state, the primary advantage this invention outperforms other well known RSSI-only methods and algorithms, is that RSSI-only algorithms always use an attenuator regardless of whether IM interference is present. The present invention offers a novel method over the prior art by using the attenuator only when needed. Thus, attenuation is provided only when IM interference is a problem. Thus, the receiver's sensitivity will remain high when no interference is being received. Since the selective use of an attenuator offers a substantial gain in the receiver's IM performance figures, the invention offers a great advantage for use in communications systems used within crowded frequency spectrum where intermodulation interference is often a concern.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method used in a radio receiver for switching an attenuator to the input of a two-way communications device to prevent interference comprising the steps of:
   measuring the relative signal strength at the input of the two-way communications device;
   comparing the relative signal strength to a first interference threshold value for determining whether to switch the attenuator to an ON state;
   comparing the relative signal strength to both a second interference threshold value which is lesser than the first interference threshold value and a receiver status information parameter to determine whether to switch the attenuator to an ON state; and
   comparing the relative signal strength to a third interference threshold value which is lesser than the second interference threshold value to determine whether to switch the attenuator to an OFF state or allow an attenuator to remain in an OFF state.

2. A method used in a radio receiver for switching an attenuator as in claim 1, wherein the first interference threshold value is used for determining if the two-way communications device is subjected to an on-channel radio frequency (RF) input signal that would cause distortion.

3. A method used in a radio receiver for switching an attenuator as in claim 1, wherein the second interference threshold value is used for determining if the two-way communications device is subject to an off-channel radio frequency (RE) input signal that would cause interference to an on-channel RF input signal.

4. A method used in a radio receiver for switching an attenuator as in claim 1, wherein the third interference threshold value is used for determining if the two-way communications device is receiving a valid on-channel radio frequency (RE) input signal.

* * * * *